(12) United States Patent
Qu et al.

(10) Patent No.: US 12,033,425 B2
(45) Date of Patent: Jul. 9, 2024

(54) DISPLAY PANEL, PREPARATION METHOD THEREFOR AND DISPLAY APPARATUS

(71) Applicant: BOE Technology Group Co., Ltd., Beijing (CN)

(72) Inventors: Caiyu Qu, Beijing (CN); Yanjun Hao, Beijing (CN); Hao Liu, Beijing (CN); Hejin Wang, Beijing (CN); Huijuan Zhang, Beijing (CN); Zheng Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 44 days.

(21) Appl. No.: 17/797,318

(22) PCT Filed: Oct. 25, 2021

(86) PCT No.: PCT/CN2021/126135
§ 371 (c)(1),
(2) Date: Aug. 3, 2022

(87) PCT Pub. No.: WO2022/151793
PCT Pub. Date: Jul. 21, 2022

(65) Prior Publication Data
US 2023/0054532 A1 Feb. 23, 2023

(30) Foreign Application Priority Data

Jan. 14, 2021 (CN) .......................... 202110049618.7

(51) Int. Cl.
| | | |
|---|---|---|
| *G06V 40/13* | (2022.01) | |
| *G06V 40/12* | (2022.01) | |
| *H10K 50/844* | (2023.01) | |
| *H10K 50/86* | (2023.01) | |
| *H10K 59/65* | (2023.01) | |
| *G02B 5/20* | (2006.01) | |
| *H10K 59/12* | (2023.01) | |
| *H10K 59/38* | (2023.01) | |

(52) U.S. Cl.
CPC ...... *G06V 40/1318* (2022.01); *G06V 40/1365* (2022.01); *H10K 50/844* (2023.02);
(Continued)

(58) Field of Classification Search
CPC .......... G06V 40/1318; G06V 40/1365; H10K 50/844; H10K 50/865; H10K 59/65;
(Continued)

(56) References Cited

U.S. PATENT DOCUMENTS

| | | | |
|---|---|---|---|
| 10,983,558 B2 * | 4/2021 | Kim | ...................... G06F 1/1637 |
| 10,984,217 B2 * | 4/2021 | Lin | ..................... G06V 40/1306 |

(Continued)

FOREIGN PATENT DOCUMENTS

| | | |
|---|---|---|
| CN | 103676358 A | 3/2014 |
| CN | 106461833 A | 2/2017 |

(Continued)

OTHER PUBLICATIONS

CN202110049618.7 first office action.
CN202110049618.7 second office action.

*Primary Examiner* — Antonio Xavier
(74) *Attorney, Agent, or Firm* — IPro, PLLC (57) ABSTRACT

Provided is a display panel including a base substrate, a display function film layer, a filter film layer, and a fingerprint recognition circuit. The display function film layer is disposed on the base substrate, and the display function film layer is provided with a plurality of light-emitting regions. The filter film layer is disposed on a side of the display function film layer away from the base substrate, wherein the filter film layer is capable of transmitting light emitted from the plurality of light-emitting regions, and a material of the filter film layer comprises a conductive material. The fingerprint recognition circuit is disposed on the base substrate, wherein the fingerprint recognition circuit is connected to the filter film layer, and configured for fingerprint recognition based on light reflected by an obstacle and received by the filter film layer.

20 Claims, 7 Drawing Sheets

(52) U.S. Cl.
CPC ........... *H10K 50/865* (2023.02); *H10K 59/65* (2023.02); *G02B 5/201* (2013.01); *H10K 59/12* (2023.02); *H10K 59/38* (2023.02)

(58) Field of Classification Search
CPC ...... H10K 59/12; H10K 59/38; H10K 59/352; H10K 59/353; H10K 59/873; H10K 59/8792; H10K 59/60; H10K 59/1201; G02B 5/201
See application file for complete search history.

(56) References Cited

U.S. PATENT DOCUMENTS

| | | | |
|---|---|---|---|
| 11,403,869 B2* | 8/2022 | Wu | H01L 27/1462 |
| 2014/0118299 A1* | 5/2014 | Wang | G09G 3/3648 345/174 |
| 2016/0026285 A1 | 1/2016 | Qin et al. | |
| 2016/0041686 A1* | 2/2016 | Kida | G06F 3/044 345/173 |
| 2017/0219432 A1* | 8/2017 | Kuri | G01J 3/26 |
| 2017/0220159 A1* | 8/2017 | Xu | G02F 1/133512 |
| 2018/0158877 A1 | 6/2018 | Zeng et al. | |
| 2019/0026527 A1* | 1/2019 | He | G02B 6/0026 |
| 2019/0324569 A1 | 10/2019 | Ma et al. | |

FOREIGN PATENT DOCUMENTS

| | | |
|---|---|---|
| CN | 107680988 A | 2/2018 |
| CN | 108563361 A | 9/2018 |
| CN | 108807716 A | 11/2018 |
| CN | 109037474 A | 12/2018 |
| CN | 112183398 A | 1/2021 |
| CN | 112885873 A | 6/2021 |
| KR | 20160056388 A | 5/2016 |
| WO | 2015195123 A1 | 12/2015 |

* cited by examiner

DISPLAY PANEL, PREPARATION METHOD THEREFOR AND DISPLAY APPARATUS

CROSS-REFERENCE TO RELATED APPLICATION

This application is a U.S. national stage of international application No. PCT/CN2021/126135, field on Oct. 25, 2021, which claims priority to Chinese Patent Application No. 202110049618.7, filed on Jan. 14, 2021 and entitled "DISPLAY PANEL AND PREPARATION METHOD THEREFOR, AND DISPLAY APPARATUS", the contents of which are incorporated herein by reference in their entireties.

TECHNICAL FIELD

The present disclosure relates to the field of display technologies, and in particular relates to a display panel and a preparation method therefor, and a display apparatus.

BACKGROUND

A display apparatus may have a fingerprint recognition function to identify a user's identity.

SUMMARY

The present disclosure provides a display panel and a preparation method therefor, and a display apparatus. The technical solutions are as follows.

In one aspect, a display panel is provided. The display panel includes:
 a base substrate;
 a display function film layer disposed on the base substrate, the display function film layer being provided with a plurality of light-emitting regions;
 a filter film layer disposed on a side of the display function film layer away from the base substrate, wherein the filter film layer is capable of transmitting light emitted from the plurality of light-emitting regions, and a material of the filter film layer includes a conductive material; and
 a fingerprint recognition circuit disposed on the base substrate, wherein the fingerprint recognition circuit is connected to the filter film layer, and configured for fingerprint recognition based on light reflected by an obstacle and received by the filter film layer.

Optionally, an orthographic projection of the filter film layer on the base substrate covers an orthographic projection of at least one light-emitting region of the plurality of light-emitting regions on the base substrate.

Optionally, the filter film layer includes: a plurality of filter patterns in one-to-one correspondence to the plurality of light-emitting regions, wherein at least one filter pattern of the plurality of filter patterns is connected to the fingerprint recognition circuit, an orthographic projection of the at least one filter pattern on the base substrate covers an orthographic projection of one corresponding light-emitting region on the base substrate, and the at least one filter pattern is capable of transmitting light emitted from the one corresponding light-emitting region.

Optionally, a distance between an edge of at least one filter pattern and an edge of the light-emitting region covered by the filter pattern ranges from 1 μm to 4 μm.

Optionally, the material of the filter film layer includes a metal material and an inorganic material.

Optionally, the filter film layer includes: at least two inorganic film layers made of the inorganic material, and at least one metal film layer made of the metal material; wherein
 the at least one metal film layer is disposed between the at least two inorganic film layers.

Optionally, one metal film layer is disposed between every two adjacent inorganic film layers.

Optionally, the filter film layer includes: two inorganic film layers and one metal film layer.

Optionally, the filter film layer includes: three inorganic film layers and two metal film layers.

Optionally, a thickness of each inorganic film layer ranges from 50 nm to 250 nm; and
 a thickness of each metal film layer ranges from 300 nm to 1000 nm.

Optionally, the inorganic material includes at least one of silicon nitride and silicon oxide; and the metal material includes at least one of molybdenum, aluminum, and molybdenum oxide.

Optionally, the display panel further includes: a thin-film encapsulation film layer; wherein
 the thin-film encapsulation film layer is disposed between the filter film layer and the display function film layer.

Optionally, the thin-film encapsulation film layer includes: a first thin-film encapsulation layer, a second thin-film encapsulation layer, and a third thin-film encapsulation layer which are laminated in sequence along a direction away from the base substrate; wherein
 materials of the first thin-film encapsulation layer and the third thin-film encapsulation layer comprise an inorganic material, and a material of the second thin-film encapsulation layer includes an organic material.

Optionally, the display panel further includes: a black matrix layer disposed on a side of the filter film layer away from the base substrate; wherein
 an orthographic projection of the black matrix layer on the base substrate and orthographic projections of the plurality of light-emitting regions on the base substrate are not overlapped or merely partially overlapped.

Optionally, the display function film layer includes: a plurality of pixel circuits and a plurality of light-emitting units in one-to-one correspondence to the plurality of pixel circuits; wherein
 each light-emitting unit is connected to one corresponding pixel circuit, and the region where each light-emitting unit is disposed forms one light-emitting region.

In another aspect, a method for preparing a display panel is provided. The method includes:
 providing a base substrate;
 forming a display function film layer on the base substrate, the display function film layer being provided with a plurality of light-emitting regions;
 forming a filter film layer on a side of the display function film layer away from the base substrate, wherein an orthographic projection of the filter film layer on the base substrate covers orthographic projections of the plurality of light-emitting regions on the base substrate, the filter film layer is capable of transmitting light emitted from the plurality of light-emitting regions, and a material of the filter film layer includes a conductive material; and
 forming a fingerprint recognition circuit on the base substrate, wherein the fingerprint recognition circuit is connected to the filter film layer, and configured for fingerprint recognition based on light reflected by an obstacle and received by the filter film layer.

In still another aspect, a display apparatus is provided. The display apparatus includes: a fingerprint recognition driving circuit and the display panel described in the above aspect; wherein
the fingerprint recognition driving circuit is connected to a fingerprint recognition circuit in the display panel, and is configured to provide a driving signal for the fingerprint recognition circuit.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

In the related art, a display apparatus with a fingerprint recognition function may include a display backplate and a capacitive fingerprint recognition circuit, and the display backplate includes a thin film transistor. Since a source and a drain in the thin film transistor are usually made of a metal material, the source and the drain may be used as detection plates for capacitive fingerprint recognition and connected to the capacitive fingerprint recognition circuit. When a user touches the display apparatus with fingers, ridges and valleys of fingerprints of the user form a capacitance with the detection plate, and the fingerprint recognition circuit can determine positions of the detected ridges and valleys according to the detected capacitance, thereby completing fingerprint recognition.

However, since the source and the drain of the thin film transistor are relatively close to a signal line in the display backplate, the source and the drain are easily interfered by the signal line. Therefore, when the source and the drain are used as detection plates, the signal-to-noise ratio of signals detected by the capacitive fingerprint recognition circuit is relatively small, and the effect of fingerprint recognition is poor.

Figure 1:
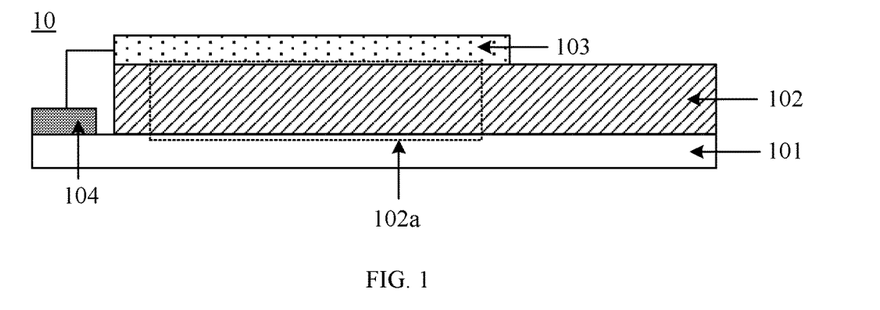
FIG. 1 is a schematic structural diagram of a display panel according to an embodiment of the present disclosure.

FIG. 1 is a schematic structural diagram of a display panel according to an embodiment of the present disclosure. Referring to FIG. 1, the display panel 10 may include a base substrate 101, a display function film layer 102, a filter film layer 103, and a fingerprint recognition circuit 104. Referring to FIG. 1, the display function film layer 102 may be disposed on the base substrate 101, and the filter film layer 103 may be disposed on the side of the display function film layer 102 away from the base substrate 101. The fingerprint recognition circuit 104 may be disposed on the base substrate 101. The fingerprint recognition circuit 104 and the display function film layer 102 may be disposed on the same side of the base substrate 101, or the fingerprint recognition circuit 104 and the display function film layer 102 may be disposed on two sides of the base substrate 101 respectively, which is not limited in the embodiment of the present disclosure.

The display function film layer 102 may be provided with a plurality of light-emitting regions 102a (only one light-emitting region 102a is shown in FIG. 1). The filter film layer 103 may transmit light emitted from the plurality of light-emitting regions 102a, and a material of the filter film layer 103 includes a conductive material. The fingerprint recognition circuit 104 may be connected to the filter film layer 103, and configured for fingerprint recognition based on the light reflected by an obstacle (for example, fingers of a user) and received by the filter film layer 103.

Since the material of the filter film layer 103 includes the conductive material, the filter film layer 103 may be used as a detection plate of the fingerprint recognition circuit 104. Since the filter film layer 103 is disposed on the side of the display function film layer 102 away from the base substrate 101, the filter film layer 103 may be relatively far away from the signal line in the display function film layer 102. The filter film layer 103 is not easily affected by the signal line in the display function film layer 102. Therefore, when the filter film layer 103 is used as the detection plate, the signal-to-noise ratio of signals detected by the fingerprint recognition circuit 104 may be relatively larger, and the effect of fingerprint recognition may be better. When the filter film layer 103 is used as the detection plate, the filter film layer 103 is closer to the obstacle than the display function film layer 102 is, such that the signals detected by the fingerprint recognition circuit 104 may have great intensity, which can ensure the effect of fingerprint recognition.

Moreover, since the filter film layer 103 can transmit the light emitted from the plurality of light-emitting regions 102a, the display panel 10 may normally display images, which ensures the display effect of the display panel 10. As the filter film layer 103 is disposed on the side of the display function film layer 102 away from the base substrate 101, the fingerprint recognition can be achieved in the case of implementing full-screen display of the display panel 10.

In summary, the embodiment of the present disclosure provides a display panel. The material of the filter film layer in the display panel includes the conductive material, and thus the filter film layer can be used as the detection plate of the fingerprint recognition circuit. In addition, since the filter film layer is disposed on the side of the display function film layer away from the base substrate, the filter film layer is relatively far away from the signal line in the display function film layer and is not easily affected by the signal line. When the filter film layer is used as the detection plate, the signal-to-noise ratio of fingerprint signals detected by the fingerprint recognition circuit can be larger, and the effect of fingerprint recognition can be better. In addition, when the filter film layer is used as the detection plate, the filter film layer is closer to the obstacle than the display function film layer is. Therefore, the signals detected by the fingerprint recognition circuit can have great intensity, which ensures the effect of fingerprint recognition.

In the embodiment of the present disclosure, referring to FIG. 1, an orthographic projection of the filter film layer 103 on the base substrate 101 may cover an orthographic projection of at least one of the plurality of light-emitting regions 102a on the base substrate 101. That is, the orthographic projection of the filter film layer 103 on the base substrate 101 may not cover the orthographic projections of some light-emitting regions 102a on the base substrate 101.

For example, the orthographic projection of the filter film layer 103 on the base substrate 101 may cover the orthographic projection of each light-emitting region 102a of the plurality of light-emitting regions 102a on the base substrate 101.

Figure 2:
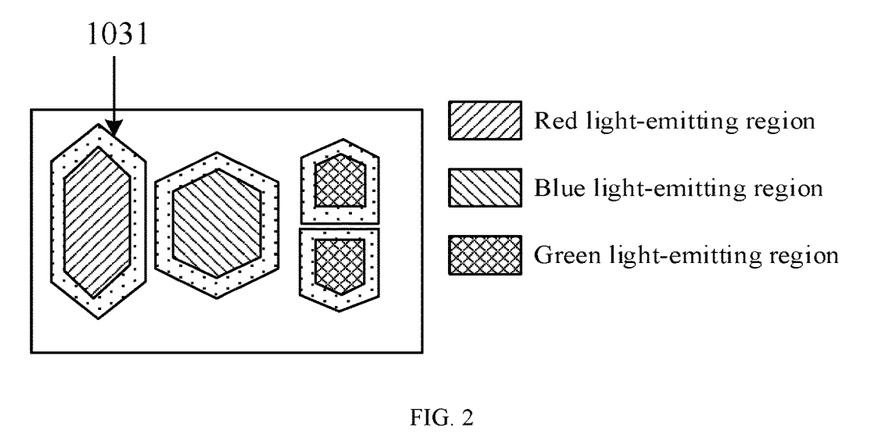
FIG. 2 is a schematic diagram of a filter film layer and light-emitting regions according to an embodiment of the present disclosure.

Referring to FIG. 2, the filter film layer 103 may include a plurality of filter patterns 1031 in one-to-one correspondence to the plurality of light-emitting regions 102a. At least one filter pattern 1031 of the plurality of filter patterns 1031 may be connected to the fingerprint recognition circuit 104. The fingerprint recognition circuit 104 may detect light reflected by an obstacle and received by the at least one connected filter pattern 1031, and then may perform fingerprint recognition based on the light reflected by the obstacle and received by the at least one filter pattern 1031. That is, the at least one filter pattern 1031, connected to the fingerprint recognition circuit 104, of the plurality of filter patterns 1031 may be used as the detection plate of the fingerprint recognition circuit. Exemplarily, each filter pattern 1031 of the plurality of filter patterns 1031 may be connected to the fingerprint recognition circuit 104.

Moreover, an orthographic projection of at least one filter pattern 1031 on the base substrate 101 may cover an orthographic projection of one corresponding light-emitting region 102a on the base substrate 101, and the at least one filter pattern 1031 may transmit the light emitted from the corresponding light-emitting region 102a. For example, the orthographic projection of each filter pattern 1031 of the plurality of filter patterns 1031 on the base substrate 101 may cover the orthographic projection of one corresponding light-emitting region 102a on the base substrate 101.

Optionally, the plurality of light-emitting regions 102a may include a red (R) light-emitting region, a green (G) light-emitting region, and a blue (B) light-emitting region. Exemplarily, FIG. 2 shows one red light-emitting region, two green light-emitting regions and one blue light-emitting region.

If the light-emitting region 102a corresponding to a filter pattern 1031 emits red light, the filter pattern 1031 can transmit red light and reflect green light and blue light. If the light-emitting region 102a corresponding to a filter pattern 1031 emits green light, the filter pattern 1031 can transmit green light and reflect red light and blue light. If the light-emitting region 102a corresponding to a filter pattern 1031 emits blue light, the filter pattern 1031 can transmit blue light and reflect red light and green light.

Optionally, the light-emitting region 102a may be pentagonal, hexagonal, octagonal, or the like. Certainly, the light-emitting region 102a may also be in other shapes, and the shape of the light-emitting region 102a is not limited in the embodiments of the present disclosure. For example, referring to FIG. 2, the shapes of the blue light-emitting region and the red light-emitting region are hexagons, and the shape of the green light-emitting region is a pentagon.

In the embodiment of the present disclosure, the distance between an edge of at least one filter pattern 1031 and an edge of the light-emitting region 102a covered by the filter pattern 1031 ranges from about 1 μm (micrometer) to 4 μm. For example, the distance between the edge of each of the plurality of filter patterns 1031 and the edge of the light-emitting regions 102a covered by the filter pattern 1031 ranges from about 1 μm to 4 μm. In this way, it can be ensured that the light emitted from the light-emitting region 102a can all be transmitted through the filter pattern 1031, thereby ensuring the display effect of the display panel.

Here, "about" may refer to a value within an error range caused by a preparation technology in a preparation process, or a value within a measurement error range in a measurement process.

The shape of the filter pattern 1031 may be the same as the shape of the light-emitting region 102a, and the edge of the filter pattern 1031 is parallel to the edge of the light-emitting region 102a. Referring to FIG. 2, the shape of the filter pattern 1031 covering the blue light-emitting region is a hexagon, the shape of the filter pattern 1031 covering the red light-emitting region is a hexagon, and the shape of the filter pattern 1031 covering the green light-emitting region is a pentagon.

The distance between the edge of the filter pattern 1031 and the edge of the light-emitting region 102a covered by the filter pattern 1031 may to the distance between each edge of the filter pattern 1031 and the corresponding edge of the light-emitting region 102a covered by the filter pattern 1031. The number of the edges of the filter pattern 1031 is related to the shape of the filter pattern 1031, and the number of the edges of the light-emitting region 102a is related to the shape of the light-emitting region 102a. For example, in the case that the filter pattern 1031 is hexagonal, the filter pattern 1031 includes 6 edges, and in the case that the light-emitting region 102a is hexagonal, the light-emitting region 102a includes 6 edges.

In the embodiment of the present disclosure, the material of the filter film layer 103 may include a metal material and an inorganic material. The inorganic material may include at least one of silicon oxide (SiOx) and silicon nitride (SiNx). The metal material may include at least one of molybdenum (Mo), aluminum (Al), and molybdenum oxide (MoO).

Optionally, the filter film layer 103 may include at least two inorganic film layers a1 made of the inorganic material and at least one metal film layer a2 made of the metal material. The at least one metal film layer a2 may be disposed between the at least two inorganic film layers a1, so as to avoid the metal film layer a2 in the filter film layer 103 from being affected by other film layers disposed on two sides of the filter film layer 103, thereby ensuring that the fingerprint recognition circuit 104 can normally complete fingerprint recognition.

Figure 3:
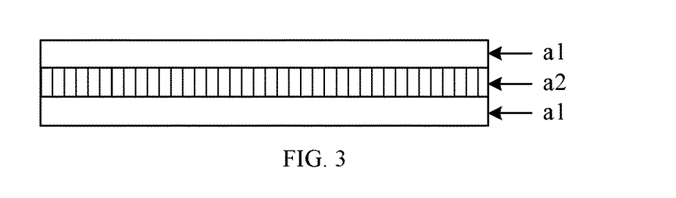
FIG. 3 is a schematic structural diagram of a filter film layer according to an embodiment of the present disclosure.
Figure 4:
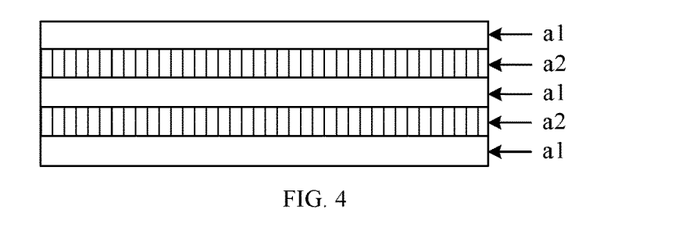
FIG. 4 is a schematic structural diagram of another filter film layer according to an embodiment of the present disclosure.

Referring to FIG. 3 and FIG. 4, one metal film layer a2 may be disposed between every two adjacent inorganic film layers a1. Therefore, the number of the inorganic film layers a1 in the filter film layer 103 may be greater than the number of the metal film layers a2 in the filter film layer 103, and the difference between the number of the inorganic film layers a1 and the number of the metal film layers a2 is 1.

Exemplarily, referring to FIG. 3, the filter film layer 103 may include two inorganic film layers a1 and one metal film layer a2. Therefore, the film layers arranged along the direction away from the base substrate 101 in the filter film layer 103 are the inorganic film layer a1, the metal film layer a2, and the inorganic film layer a1 sequentially. Alternatively, referring to FIG. 4, the filter film layer 103 may include three inorganic film layers a1 and two metal film layers a2. Therefore, the film layers arranged along the direction away from the base substrate 101 in the filter film layer 103 are the inorganic film layer a1, the metal film layer a2, the inorganic film layer a1, the metal film layer a2, and the inorganic film layer a1 sequentially.

Certainly, the filter film layer 103 may also include more inorganic film layers a1 and more metal film layers a2. The number of the inorganic film layers and the number of the metal film layers included in the filter film layer 103 are not limited in the embodiments of the present disclosure.

In the embodiment of the present disclosure, the thickness of each inorganic film layer a1 ranges from about 50 nm (nanometers) to 250 nm, and the thickness of each metal film layer a2 ranges from about 300 nm to 1000 nm.

Figure 5:
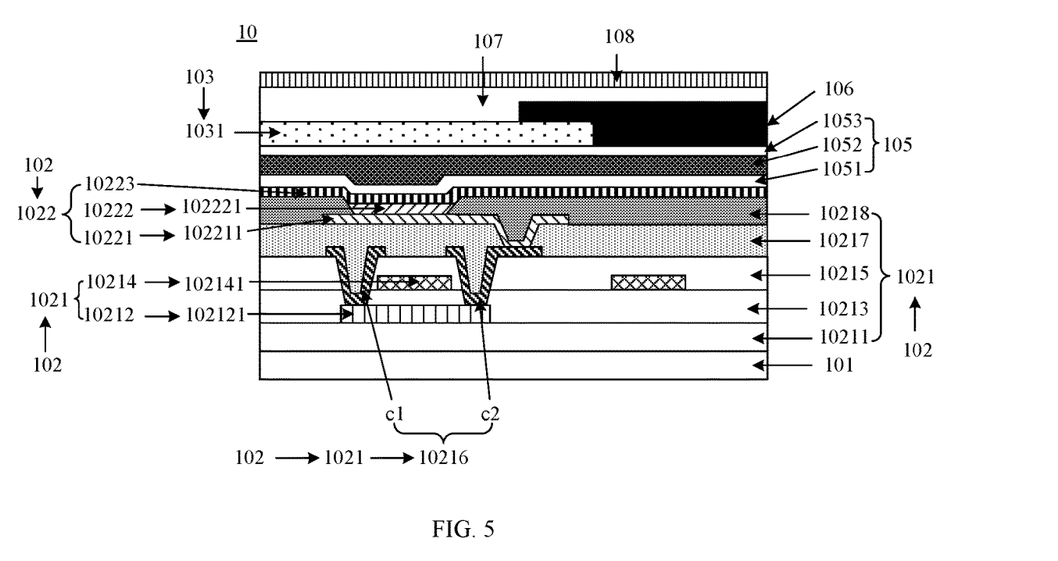
FIG. 5 is a schematic structural diagram of another display panel according to an embodiment of the present disclosure.

FIG. 5 is a schematic structural diagram of another display panel according to an embodiment of the present disclosure. Referring to FIG. 5, the display panel 10 may further include a thin-film encapsulation (TFE) film layer 105. The TFE film layer 105 may be configured to encapsulate the display function film layer 102 to prevent moisture from entering the display function film layer 102, so as to prevent the display effect of the display panel 10 from being affected.

Assuming that the TFE film layer 105 is disposed on the side of the filter film layer 103 away from the base substrate, then the distance between the filter film layer 103 as the detection plate and the obstacle may be positively correlated to a thickness of the TFE film layer 105. That is, the grater the thickness the TFE film layer 105 is, the greater the distance between the filter film layer 103 and the obstacle is; and the smaller the thickness of the TFE film layer 105 is, the smaller the distance between the filter film layer 103 and the obstacle is.

The capacitance difference between first capacitance formed by ridges of fingerprints and the detection plate and second capacitance formed by valleys of the fingerprints and the detection plate is negatively correlated to the distance between the filter film layer 103 and the obstacle. That is, the larger the distance between the filter film layer 103 and the obstacle is, the smaller the capacitance difference is; and the smaller the distance between the filter film layer 103 and the obstacle is, the larger the capacitance difference is.

Figure 6:
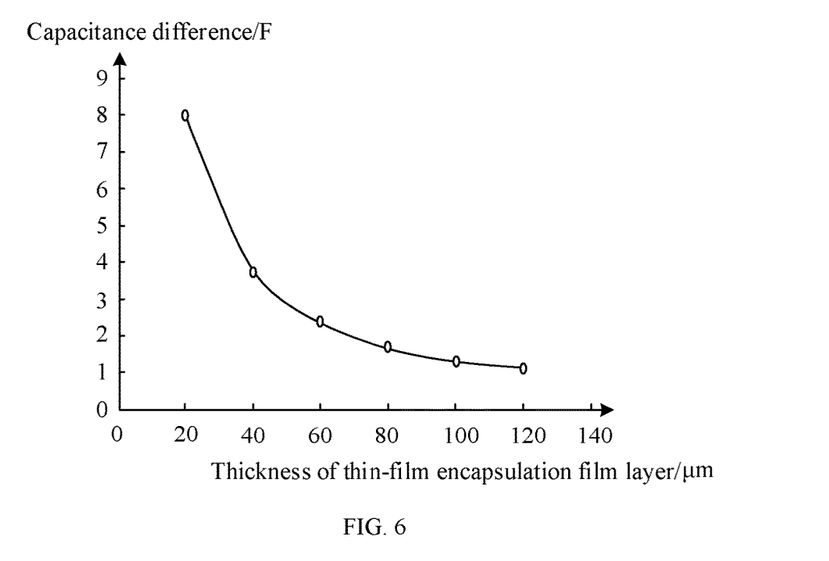
FIG. 6 is a schematic diagram showing a relationship between a capacitance difference and a thickness of a thin-film encapsulation film layer when the thin-film encapsulation film layer is disposed on a side of a filter film layer away from a base substrate according to an embodiment of the present disclosure.

When the capacitance difference is larger, it's easier for the fingerprint recognition circuit 104 to identify the ridges and valleys of the fingerprints, and the effect of fingerprint recognition is better; and when the capacitance difference is smaller, it's more difficult for the fingerprint recognition circuit 104 to identify the ridges and valleys of the fingerprints, and the effect of fingerprint recognition is poorer. Therefore, referring to FIG. 6, the capacitance difference is negatively correlated to the thickness of the TFE film layer 105. That is, the greater the thickness of the TFE film layer 105 is, the smaller the capacitance difference is, and the poorer the effect of fingerprint recognition is. The smaller the thickness of the TFE film layer 105 is, the larger the capacitance difference is, and the better the effect of fingerprint recognition is. In FIG. 6, the abscissa is the thickness of the TFE film layer 105, and the unit is μm; and the ordinate is the capacitance difference, and the unit is farads (F).

Therefore, in order to ensure the effect of fingerprint recognition of the fingerprint recognition circuit 104, the TFE film layer 105 needs to be thinner. However, in order to ensure the encapsulation effect of the TFE film layer 105 for the display function film layer 102 at the same time, the TFE film layer 105 should not be too thin. Therefore, referring to FIG. 5, the TFE film layer 105 may be disposed between the filter film layer 103 and the display function film layer 102. In this way, on the one hand, the encapsulation effect of the TFE film layer 105 for the display function film layer 102 can be ensured; and on the other hand, the distance between the filter film layer 103 and the obstacle can be prevented from being too large, so as to ensure the effect of fingerprint recognition of the fingerprint recognition circuit 104.

The TFE film layer 105 is disposed between the filter film layer 103 and the display function film layer 102, that is, the filter film layer 103 may be disposed on the side of the TFE film layer 105 away from the base substrate 101. When the filter film layer 103 is used as the detection plate, the filter film layer 103 may be closer to the obstacle, which can ensure that the signals detected by the fingerprint recognition circuit 104 have great intensity and ensure the effect of fingerprint recognition.

Referring to FIG. 5, the TFE film layer 105 may include: a first TFE layer 1051, a second TFE layer 1052, and a third TFE layer 1053 which are laminated in sequence along the direction away from the base substrate 101. Materials of the first TFE layer 1051 and the third TFE layer 1053 may include an inorganic material, and a material of the second TFE layer 1052 includes an organic material. For example, the first TFE layer 1051 and the third TFE layer 1053 may be made of one or more inorganic oxides including as SiNx, SiOx, SiOxNy (silicon oxynitride) and the like. The second TFE layer 1052 may be made of a resin material. The resin may be thermoplastic resin or thermosetting resin. The thermoplastic resin may include acrylic (PMMA) resin, and the thermosetting resin may include epoxy resin.

Optionally, the second TFE layer 1052 may be manufactured by ink jet printing (IJP). The first TFE layer 1051 and the third TFE layer 1053 may be manufactured by chemical vapor deposition (CVD).

Referring to FIG. 5, the display panel 10 may further include a black matrix (BM) layer 106 disposed on the side of the filter film layer 103 away from the base substrate 101. An orthographic projection of the black matrix layer 106 on the base substrate 101 and orthographic projections of the plurality of light-emitting regions 102a on the base substrate 101 may be not overlapped or merely partially overlapped.

The black matrix layer 106 can block the light emitted from the light-emitting regions 102a. Therefore, the orthographic projection of the black matrix layer 106 on the base substrate 101 and the orthographic projections of the plurality of light-emitting regions 102a on the base substrate 101 are not overlapped or merely partially overlapped, which can avoid the black matrix layer 106 from completely blocking the light emitted from the light-emitting regions 102a, thereby ensuring normal display of the display panel.

Optionally, the black matrix layer 106 may also be disposed on the side of the filter film layer 103 close to the base substrate 101, or the black matrix layer 106 may be disposed on the same layer as the filter film layer 103. The position of the black matrix layer 106 is not limited in the embodiments of the present disclosure.

In the embodiment of the present disclosure, the display function film layer 102 may include a plurality of pixel circuits and a plurality of light-emitting units in one-to-one correspondence to the plurality of pixel circuits. Each light-emitting unit may be connected to one corresponding pixel circuit, and the region where each light-emitting unit is disposed is one light-emitting region 102a.

Referring to FIG. 5, the display function film layer 102 may include a transistor device layer 1021 and a light-emitting function film layer 1022. The transistor device layer 1021 may include a buffer layer 10211, an active layer 10212, a gate insulating (GI) layer 10213, a gate layer 10214, an interlayer dielectric (ILD) layer 10215, a source/drain layer 10216, a planarization (PLN) layer 10217, and a pixel definition layer (PDL) 10218 which are laminated in sequence on the direction away from the base substrate 10. The light-emitting function film layer 1022 may include a first electrode layer 10221, a light-emitting layer 10222, and a second electrode layer 10223 which are laminated in sequence along the direction away from the base substrate 101.

The active layer 10212 may include a plurality of active patterns 102121, and the gate layer 10214 may include a plurality of gate patterns 102141 in one-to-one correspondence to the plurality of active patterns 102121. The source/drain layer 10216 may include a plurality of sources (S) c1 in one-to-one correspondence to the plurality of active patterns 102121, and a plurality of drains (D) c2 in one-to-one correspondence to the plurality of sources c1. Each active pattern 102121, the corresponding gate pattern 102141, the corresponding source c1 and the corresponding drain c2 form a pixel circuit. The source c1 and the drain c2 in each pixel circuit are connected to the active pattern 102121.

In addition, the first electrode layer 10221 may include a plurality of electrode patterns 102211, and the light-emitting layer 10222 may include a plurality of light-emitting patterns 102221 in one-to-one correspondence to the plurality of electrode patterns 102211. Each electrode pattern 102211, the corresponding light-emitting pattern 102221 and the second electrode layer 10223 may form one light-emitting unit. Referring to FIG. 5, the drain c2 in each pixel circuit may be connected to the electrode pattern 102211 of one corresponding light-emitting unit.

Figure 7:
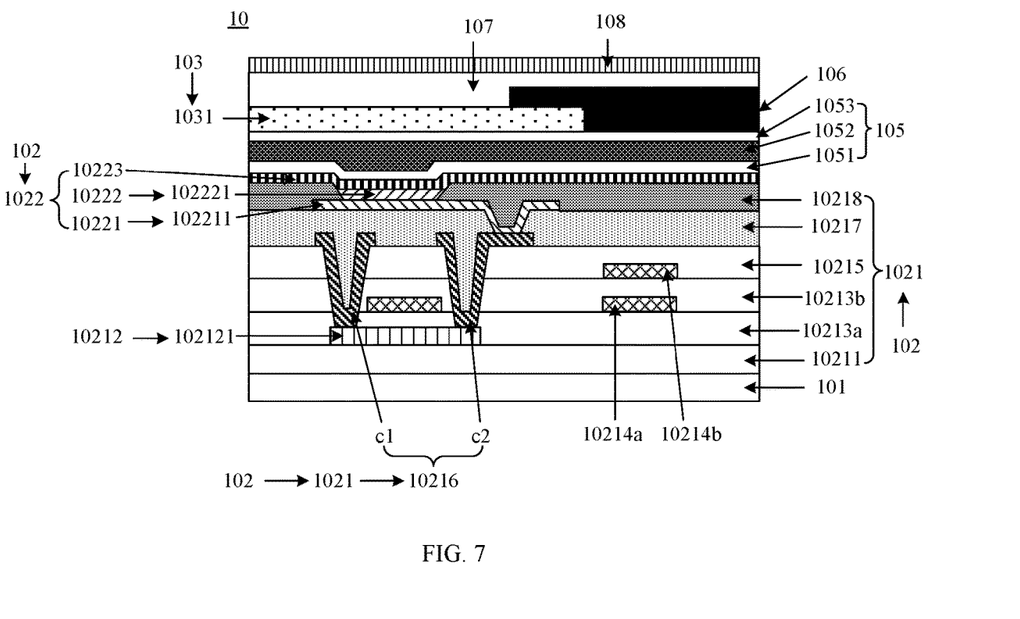
FIG. 7 is a schematic structural diagram of still another display panel according to an embodiment of the present disclosure.

FIG. 7 is a schematic structural diagram of yet another display panel according to an embodiment of the present disclosure. Referring to FIG. 7, the transistor device layer 1021 in the display function film layer 102 may include two gate layers 10214 and two gate insulating layers 10213. Referring to FIG. 7, the buffer layer 10211, the active layer 10212, the first gate insulating layer 10213a, the first gate layer 10214a, the second gate insulating layer 10213b, the second gate layer 10214b, the interlayer dielectric layer 10215, the source/drain layer 10216, the planarization layer 10217, and the pixel definition layer 10218 are sequentially laminated along the direction away from the base substrate 101.

Referring to FIG. 5 and FIG. 7, the display panel 10 may further include an adhesive layer 107 disposed on the side of the black matrix layer 106 away from the base substrate 101, and a cover film 108 disposed on the side of the adhesive layer 107 away from the base substrate 101. The material of the adhesive layer 107 may be optically clear adhesive (OCA). The fingerprint recognition circuit 104 is not shown in FIG. 5 and FIG. 7.

Figure 8:
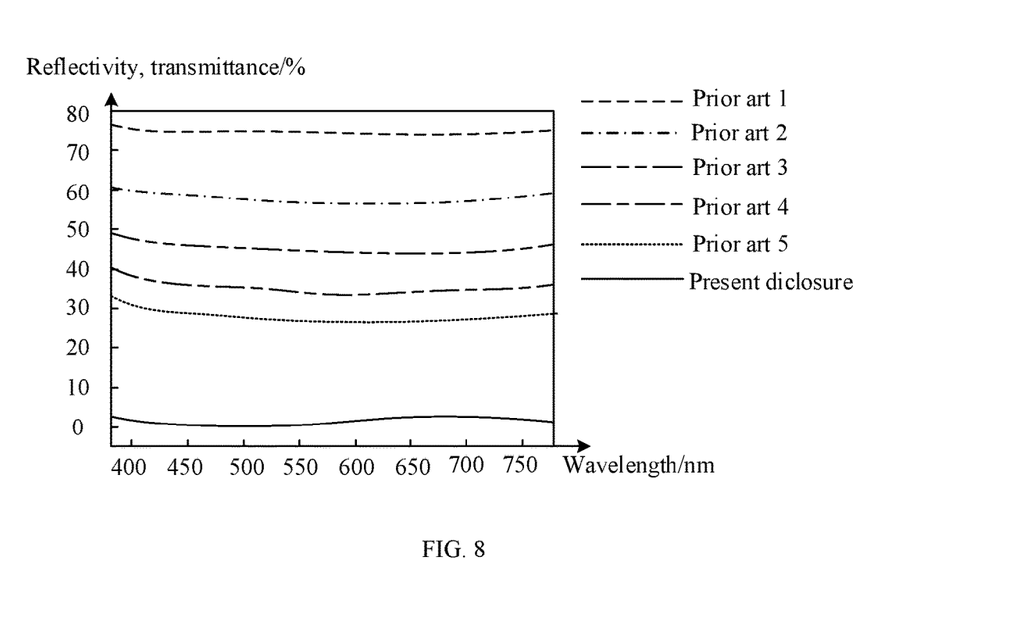
FIG. 8 shows reflectivity and transmittance curves of detection plates according to the present disclosure and prior arts.

FIG. 8 show reflectivity and transmittance curves of detection plates according to the present disclosure and prior arts. It can be seen with reference to FIG. 8 that the reflectivity and transmittance of the detection plate in the display panel according to the embodiments of the present disclosure are lower than the reflectivity and transmittance of the detection plates in the display panels of the prior arts (the reflectivity and transmittance of the detection plates in the display panels of five prior arts are shown in FIG. 8). Due to the lower reflectivity and transmittance of the detection plate, the effect of fingerprint recognition of the fingerprint recognition circuit 104 is better. That is, the effect of fingerprint recognition of the fingerprint recognition circuit 104 in the display panel according to the embodiments of the present disclosure can be better.

In FIG. 8, the abscissa is a wavelength, and the unit is nm, and the ordinate is the reflectivity or transmittance, and the unit is %. The reflectivity and the transmittance are approximately overlapped, so each curve in FIG. 8 represents the transmittance and reflectivity of one display panel.

In summary, the embodiment of the present disclosure provides a display panel. The material of the filter film layer in the display panel includes the conductive material, and thus the filter film layer can be used as the detection plate of the fingerprint recognition circuit. In addition, since the filter film layer is disposed on the side of the display function film layer away from the base substrate, the filter film layer is relatively far away from the signal line in the display function film layer and is not easily affected by the signal line. When the filter film layer is used as the detection plate, the signal-to-noise ratio of fingerprint signals detected by the fingerprint recognition circuit can be larger, and the effect of fingerprint recognition can be better. In addition, when the filter film layer is used as the detection plate, the filter film layer is closer to the obstacle than the display function film layer is. Therefore, the signals detected by the fingerprint recognition circuit can have great intensity, which ensures the effect of fingerprint recognition.

Figure 9:
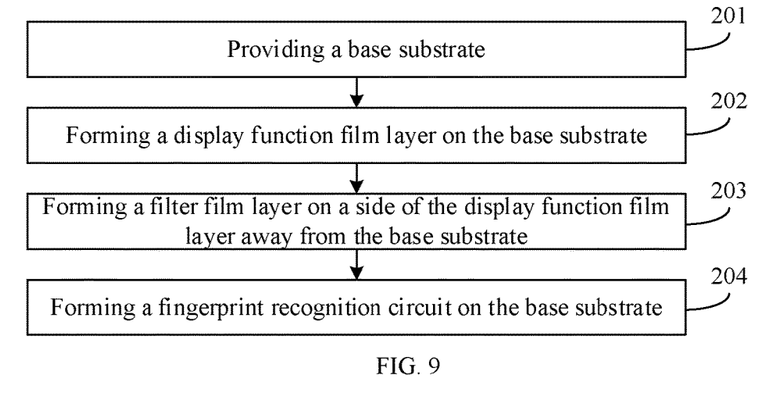
FIG. 9 is a flowchart of a method for preparing a display panel according to an embodiment of the present disclosure.

FIG. 9 is a flowchart of a method for preparing a display panel according to an embodiment of the present disclosure. The method may be applied to prepare the display panel 10 according to the above embodiments. As can be seen with reference to FIG. 9, the method may include the following steps.

In step 201, a base substrate is provided.

In the embodiment of the present disclosure, when the display panel is to be prepared, the base substrate 101 may be acquired at first. The base substrate 101 may be a flexible substrate. Exemplarily, the base substrate 101 may be made of a flexible material, and the flexible material may be polyimide (PI). A thickness of the base substrate 101 may range from 5 μm to 10 μm.

In step 202, a display function film layer is formed on the base substrate.

In the embodiment of the present disclosure, after the base substrate 101 is acquired, the display function film layer 102 may be formed on the base substrate 101. The display function film layer 102 includes a plurality of light-emitting regions 102a.

In step 203, a filter film layer is formed on a side of the display function film layer away from the base substrate.

In the embodiment of the present disclosure, after the display function film layer 102 is formed, the filter film layer 103 may be formed on the side of the display function film layer 102 away from the base substrate 101. The filter film layer 103 can transmit light emitted from the plurality of light-emitting regions 102a, and a material of the filter film layer 103 includes a conductive material.

In step 204, a fingerprint recognition circuit is formed on the base substrate.

The fingerprint recognition circuit 104 is connected to the filter film layer 103 and is configured for fingerprint recognition based on the light reflected by an obstacle and received by the filter film layer 103.

Since the material of the filter film layer 103 includes the conductive material, the filter film layer 103 can be used as a detection plate of the fingerprint recognition circuit 104. Since the filter film layer 103 is disposed on the side of the display function film layer 102 away from the base substrate 101, the filter film layer 103 is relatively far away from a signal line in the display function film layer 102, such that the filter film layer 103 is not easily affected by the signal line in the display function film layer 102. Therefore, when the filter film layer 103 is used as the detection plate, the signal-to-noise ratio of signals detected by the fingerprint recognition circuit 104 can be larger, and the effect of fingerprint recognition can be better.

In summary, the embodiment of the present disclosure provides a method for preparing a display panel. The material of the filter film layer in the display panel prepared by the method includes the conductive material, and thus the filter film layer can be used as the detection plate of the fingerprint recognition circuit. In addition, since the filter film layer is disposed on the side of the display function film layer away from the base substrate, the filter film layer is relatively far away from the signal line in the display function film layer and is not easily affected by the signal line. When the filter film layer is used as the detection plate, the signal-to-noise ratio of fingerprint signals detected by the fingerprint recognition circuit can be larger, and the effect of fingerprint recognition can be better. In addition, when the filter film layer is used as the detection plate, the filter film layer is closer to the obstacle than the display function film layer is. Therefore, the signals detected by the fingerprint recognition circuit can have great intensity, which ensures the effect of fingerprint recognition.

Figure 10:
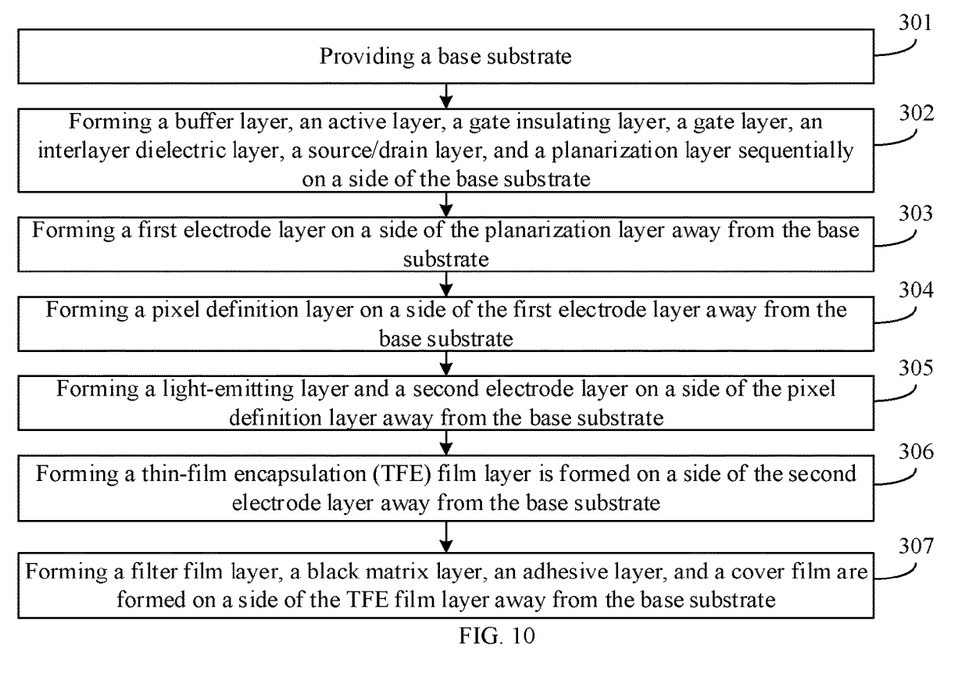
FIG. 10 is a flowchart of another method for preparing a display panel according to an embodiment of the present disclosure.

FIG. 10 is a flowchart of another method for preparing a display panel according to an embodiment of the present disclosure. The method may be applied to prepare the display panel 10 according to the above embodiments. As can be seen with reference to FIG. 10, the method may include the following steps.

In step 301, a base substrate is provided.

In the embodiment of the present disclosure, when the display panel is to be prepared, the base substrate 101 may be acquired at first. The base substrate 101 may be a flexible substrate. Exemplarily, the base substrate 101 may be made of a flexible material, and the flexible material may be polyimide (PI). A thickness of the base substrate 101 may range from 5 μm to 10 μm.

Moreover, after the base substrate 101 is acquired, the base substrate 101 may be cleaned to ensure the yield of the prepared display panel.

In step 302, a buffer layer, an active layer, a gate insulating layer, a gate layer, an interlayer dielectric layer, a source/drain layer, and a planarization layer are sequentially formed on a side of the base substrate.

In the embodiment of the present disclosure, after the base substrate 101 is acquired, the buffer layer 10211, the active layer 10212, the gate insulating layer 10213, the gate layer 10214, the interlayer dielectric layer 10215, the source/drain layer 10216, and the planarization layer 10217 may be sequentially formed on a side of the base substrate 101. The source/drain layer 10216 may include a source and a drain. The source and the drain may be prepared by a single preparation process.

The buffer layer 10211 may be formed by plasma enhanced chemical vapor deposition (PECVD). The buffer layer 10211 is of a double-layer structure, and one layer may be a silicon nitride film, and the other layer may be a silicon dioxide film. When the buffer layer 10211 is to be formed, the silicon nitride film with a thickness of 50 nm to 150 nm may be deposited at first, and then the silicon dioxide film with a thickness of 100 nm to 350 nm may be deposited.

After the buffer layer 10211 is prepared, an active film layer with a thickness of 30 nm to 60 nm may be deposited by PECVD. The active film layer is prepared from amorphous silicon. Afterwards, the active film layer is heated at a temperature of 400 degrees Celsius (° C.) to 450° C. for 0.5 hour to 3 hours. Finally, excimer laser annealing (ELA) treatment is performed on the active film layer to acquire the active layer 10212.

Afterwards, the gate insulating layer 10213, the gate layer 10214, the interlayer dielectric layer 10215, the source/drain layer 10216, and the planarization layer 10217 are sequentially formed on the side of the active layer 10212 away from the base substrate 101.

In step 303, a first electrode layer is formed on a side of the planarization layer away from the base substrate.

Figure 11:
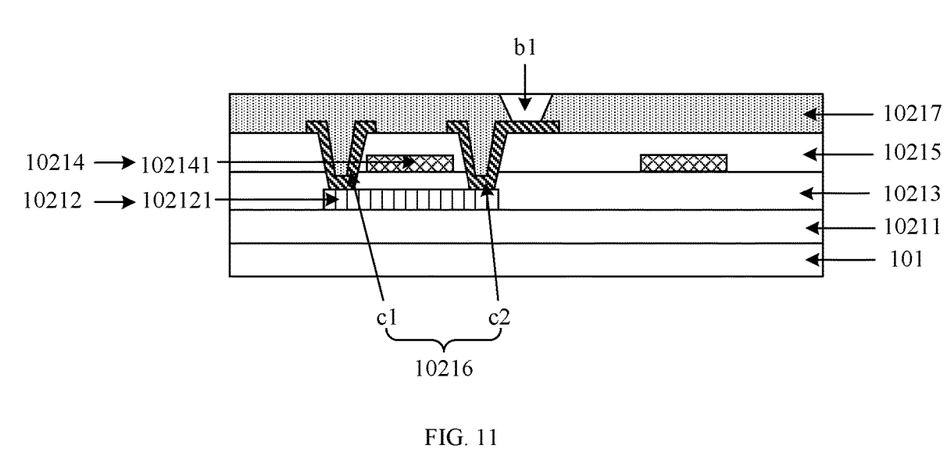
FIG. 11 is a schematic diagram of formation of a planarization layer according to an embodiment of the present disclosure.
Figure 12:
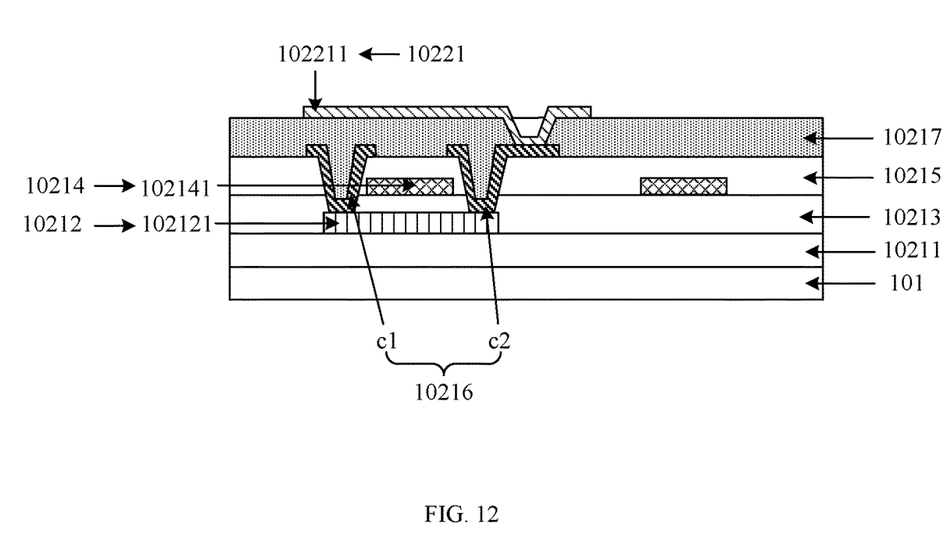
FIG. 12 is a schematic diagram of formation of a first electrode layer according to an embodiment of the present disclosure.

In the embodiment of the present disclosure, referring to FIG. 11, the planarization layer 10217 may be provided with a plurality of first via holes b1, and each first via hole b1 may expose one drain. Referring to FIG. 12, the first electrode layer 10221 may be formed on the side of the planarization layer 10217 away from the base substrate 101. Each electrode pattern 102211 in the first electrode layer 10221 is disposed in one first via hole b1 and is connected to the exposed drain.

In step 304, a pixel definition layer is formed on a side of the first electrode layer away from the base substrate.

Figure 13:
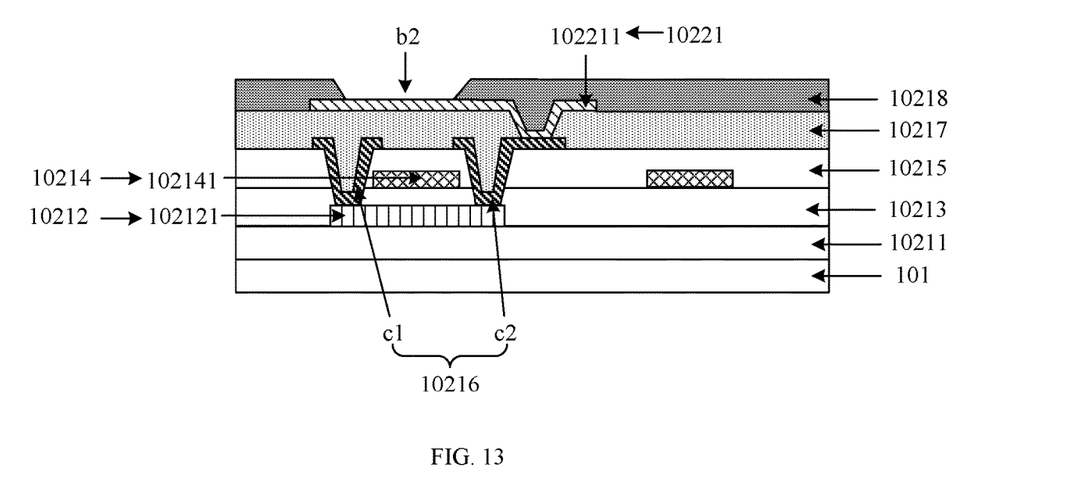
FIG. 13 is a schematic diagram of formation of a pixel definition layer according to an embodiment of the present disclosure.

In the embodiment of the present disclosure, referring to FIG. 13, the pixel definition layer 10218 may be formed on the side of the first electrode layer 10221 away from the base substrate 101. The pixel definition layer 10218 may be provided with a plurality of second via holes b2, and each second via hole b2 may expose one electrode pattern 102211.

In step 305, a light-emitting layer and a second electrode layer are formed on a side of the pixel definition layer away from the base substrate.

Figure 14:
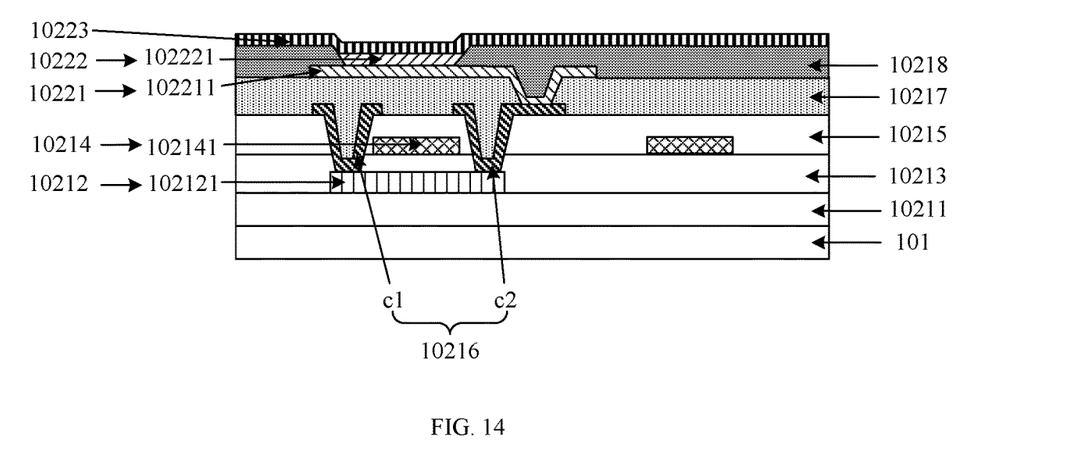
FIG. 14 is a schematic diagram of formation of a light-emitting layer and a second electrode layer according to an embodiment of the present disclosure.

In the embodiment of the present disclosure, the light-emitting layer 10222 may include a plurality of light-emitting patterns 102221. Referring to FIG. 14, each light-emitting pattern 102221 may be disposed within one second via hole b2 of the pixel definition layer 10218. The second electrode layer 10223 is formed on the side of the light-emitting layer 10222 away from the base substrate 101.

In step 306, a thin-film encapsulation (TFE) film layer is formed on a side of the second electrode layer away from the base substrate.

In the embodiment of the present disclosure, a first TFE layer 1051, a second TFE layer 1052 and a third TFE layer 1053 may be sequentially formed on the side of the second electrode layer 10223 away from the base substrate 101. The second TFE layer 1052 may be manufactured by IJP. The first TFE layer 1051 and the third TFE layer 1053 may be manufactured by CVD.

In step 307, a filter film layer, a black matrix layer, an adhesive layer, and a cover film are formed on a side of the TFE film layer away from the base substrate.

In the embodiment of the present disclosure, referring to FIG. 5, after the TFE film layer 105 is formed, the filter film layer 103, the black matrix layer 106, the adhesive layer 107 and the cover film 108 may be formed on the side of the TFE film layer 105 away from the base substrate 101.

In summary, the embodiment of the present disclosure provides a method for preparing a display panel. The material of the filter film layer in the display panel prepared by the method includes the conductive material, and thus the filter film layer can be used as the detection plate of the fingerprint recognition circuit. In addition, since the filter film layer is disposed on the side of the display function film layer away from the base substrate, the filter film layer is relatively far away from the signal line in the display function film layer and is not easily affected by the signal line. When the filter film layer is used as the detection plate, the signal-to-noise ratio of fingerprint signals detected by the fingerprint recognition circuit can be larger, and the effect of fingerprint recognition can be better. In addition, when the filter film layer is used as the detection plate, the filter film layer is closer to the obstacle than the display function film layer is. Therefore, the signals detected by the fingerprint recognition circuit can have great intensity, which ensures the effect of fingerprint recognition.

Figure 15:
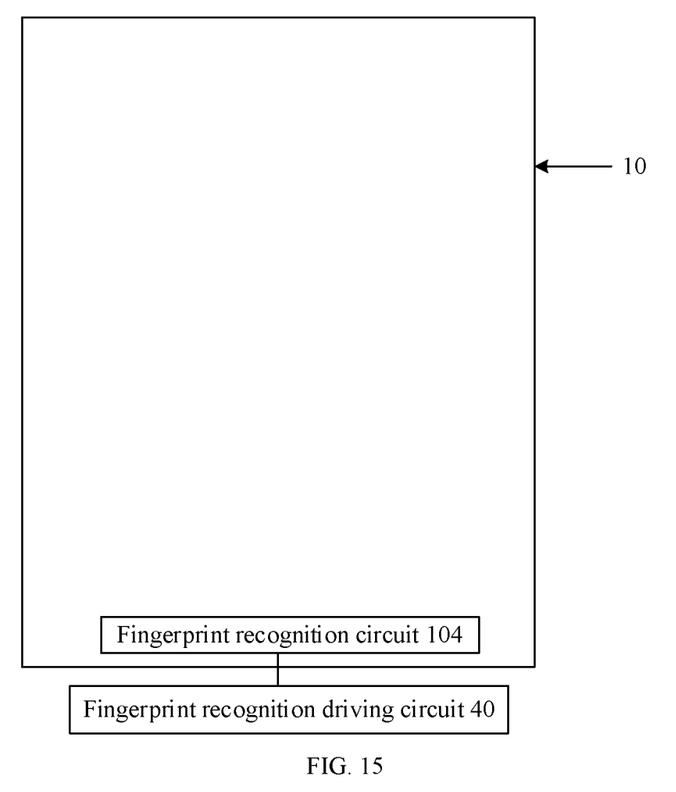
FIG. 15 is a schematic structural diagram of a display apparatus according to an embodiment of the present disclosure.

FIG. 15 is a schematic structural diagram of a display apparatus according to an embodiment of the present disclosure. Referring to FIG. 15, the display apparatus may include a fingerprint recognition driving circuit 40 and the display panel 10 according to the above embodiments. The fingerprint recognition driving circuit 40 may be connected to the fingerprint recognition circuit 104 in the display panel 10 and configured to provide a driving signal for the fingerprint recognition circuit 104.

Optionally, the display apparatus may be any other product or component having a display function, such as an organic light-emitting diode (OLED) display apparatus, a quantum dot light-emitting diode (QLED) display apparatus, electronic paper, a mobile phone, a tablet computer, a television, a display, a notebook computer, a digital photo frame or a navigator.

Described above are merely optional embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A display panel, comprising:
   a base substrate;
   a display function film layer disposed on the base substrate, the display function film layer being provided with a plurality of light-emitting regions;
   a filter film layer disposed on a side of the display function film layer away from the base substrate, wherein the filter film layer is capable of transmitting light emitted from the plurality of light-emitting regions, and a material of the filter film layer comprises a conductive material; and
   a fingerprint recognition circuit disposed on the base substrate, wherein the fingerprint recognition circuit is connected to the filter film layer, and configured for fingerprint recognition by using the filter film layer as a detection plate of a capacitive fingerprint recognition circuit.

2. The display panel according to claim 1, wherein an orthographic projection of the filter film layer on the base substrate covers an orthographic projection of at least one light-emitting region of the plurality of light-emitting regions on the base substrate.

3. The display panel according to claim 2, wherein the filter film layer comprises: a plurality of filter patterns in one-to-one correspondence to the plurality of light-emitting regions, wherein at least one filter pattern of the plurality of filter patterns is connected to the fingerprint recognition circuit, an orthographic projection of the at least one filter pattern on the base substrate covers an orthographic projection of one corresponding light-emitting region on the base substrate, and the at least one filter pattern is capable of transmitting light emitted from the one corresponding light-emitting region.

4. The display panel according to claim 1, wherein a distance between an edge of at least one filter pattern and an edge of the light-emitting region covered by the filter pattern ranges from 1 μm to 4 μm.

5. The display panel according to claim 1, wherein the material of the filter film layer comprises a metal material and an inorganic material.

6. The display panel according to claim 5, wherein the filter film layer comprises: at least two inorganic film layers made of the inorganic material, and at least one metal film layer made of the metal material; wherein
   the at least one metal film layer is disposed between the at least two inorganic film layers.

7. The display panel according to claim 6, wherein one metal film layer is disposed between every two adjacent inorganic film layers.

8. The display panel according to claim 7, wherein the filter film layer comprises: two inorganic film layers and one metal film layer.

9. The display panel according to claim 7, wherein the filter film layer comprises: three inorganic film layers and two metal film layers.

10. The display panel according to claim 6, wherein
    a thickness of each inorganic film layer ranges from 50 nm to 250 nm; and
    a thickness of each metal film layer ranges from 300 nm to 1000 nm.

11. The display panel according to claim 6, wherein the inorganic material comprises at least one of silicon nitride and silicon oxide; and the metal material comprises at least one of molybdenum, aluminum, and molybdenum oxide.

12. The display panel according to claim 1, further comprising: thin-film encapsulation film layer; wherein
    the thin-film encapsulation film layer is disposed between the filter film layer and the display function film layer.

13. The display panel according to claim 12, wherein the thin-film encapsulation film layer comprises: a first thin-film encapsulation layer, a second thin-film encapsulation layer, and a third thin-film encapsulation layer which are laminated in sequence along a direction away from the base substrate; wherein materials of the first thin-film encapsulation layer and the third thin-film encapsulation layer comprise an inorganic material, and a material of the second thin-film encapsulation layer comprises an organic material.

14. The display panel according to claim 1, further comprising: a black matrix layer disposed on a side of the filter film layer away from the base substrate; wherein
an orthographic projection of the black matrix layer on the base substrate and orthographic projections of the plurality of light-emitting regions on the base substrate are not overlapped or merely partially overlapped.

15. The display panel according to claim 1, wherein the display function film layer comprises: a plurality of pixel circuits and a plurality of light-emitting units in one-to-one correspondence to the plurality of pixel circuits; wherein
each light-emitting unit is connected to one corresponding pixel circuit, and the region where each light-emitting unit is disposed forms one light-emitting region.

16. A method for preparing a display panel, comprising:
providing a base substrate;
forming a display function film layer on the base substrate, the display function film layer being provided with a plurality of light-emitting regions;
forming a filter film layer on a side of the display function film layer away from the base substrate, wherein the filter film layer is capable of transmitting light emitted from the plurality of light-emitting regions, and a material of the filter film layer comprises a conductive material; and
forming a fingerprint recognition circuit on the base substrate, wherein the fingerprint recognition circuit is connected to the filter film layer, and configured for fingerprint recognition by using the filter film layer as a detection plate of a capacitive fingerprint recognition circuit.

17. A display apparatus, comprising: a fingerprint recognition driving circuit and a display panel; wherein the display panel comprises:
a base substrate;
a display function film layer disposed on the base substrate, the display function film layer being provided with a plurality of light-emitting regions;
a filter film layer disposed on a side of the display function film layer away from the base substrate, wherein the filter film layer is capable of transmitting light emitted from the plurality of light-emitting regions, and a material of the filter film layer comprises a conductive material; and
a fingerprint recognition circuit disposed on the base substrate, wherein the fingerprint recognition circuit is connected to the filter film layer, and configured for fingerprint recognition by using the filter film layer as a detection plate of a capacitive fingerprint recognition circuit; and
wherein the fingerprint recognition driving circuit is connected to the fingerprint recognition circuit in the display panel, and is configured to provide a driving signal for the fingerprint recognition circuit.

18. The display apparatus according to claim 17, wherein an orthographic projection of the filter film layer on the base substrate covers an orthographic projection of at least one light-emitting region of the plurality of light-emitting regions on the base substrate.

19. The display apparatus according to claim 18, wherein the filter film layer comprises: a plurality of filter patterns in one-to-one correspondence to the plurality of light-emitting regions, wherein at least one filter pattern of the plurality of filter patterns is connected to the fingerprint recognition circuit, an orthographic projection of the at least one filter pattern on the base substrate covers an orthographic projection of one corresponding light-emitting region on the base substrate, and the at least one filter pattern is capable of transmitting light emitted from the one corresponding light-emitting region.

20. The display apparatus according to claim 17, wherein a distance between an edge of at least one filter pattern and an edge of the light-emitting region covered by the filter pattern ranges from 1 μm to 4 μm.

* * * * *